US009205572B1

(12) United States Patent
Yeh

(10) Patent No.: US 9,205,572 B1
(45) Date of Patent: Dec. 8, 2015

(54) INGOT CUTTING METHOD CAPABLE OF REDUCING WAFER DAMAGE PERCENTAGE

(71) Applicant: National Tsing Hua University, Hsinchu (TW)

(72) Inventor: Jer-Liang Yeh, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/288,702

(22) Filed: May 28, 2014

(51) Int. Cl.
*H01L 21/78* (2006.01)
*B28D 5/00* (2006.01)
*B28D 5/04* (2006.01)

(52) U.S. Cl.
CPC .............. *B28D 5/0082* (2013.01); *B28D 5/045* (2013.01)

(58) Field of Classification Search
None
See application file for complete search history.

(56) References Cited

U.S. PATENT DOCUMENTS 8,256,407 B2 9/2012 Kawasaki et al.
2011/0214806 A1* 9/2011 Ghyselen ...................... 156/247
2012/0193764 A1* 8/2012 Chyan et al. ................. 257/618

* cited by examiner

*Primary Examiner* — Alexander Ghyka
(74) *Attorney, Agent, or Firm* — Ming Chow; Sinorica, LLC

(57) ABSTRACT

An ingot cutting method capable of reducing wafer damage percentage, comprising: forming a layer of nanostructures on at least one surface of an ingot; depositing a buffer layer on the layer of nanostructures; fixing the ingot to a mounting plate by applying a layer of epoxy between the buffer layer and the mounting plate; performing a dicing process on the ingot to get a plurality of wafers; and performing an epoxy removal process on the plurality of wafers.

4 Claims, 8 Drawing Sheets

INGOT CUTTING METHOD CAPABLE OF REDUCING WAFER DAMAGE PERCENTAGE

BACKGROUND OF THE INVENTION

1. Field of the Invention

The present invention relates to an ingot cutting method, especially to an ingot cutting method capable of reducing damage rate.

2. Description of the Related Art

An ingot dicing process generally requires the steps of: (a) attaching a glass plate onto a steel holder by applying a layer of epoxy between a back surface of the glass plate and a front surface of the steel holder; (b) attaching an ingot onto the glass plate by applying a layer of epoxy between a back surface of the ingot and a front surface of the glass plate; (c) wire sawing the ingot to get a plurality of wafers (d); and removing epoxy remnants from the plurality of wafers (e).

In the process mentioned above, the glass plate is used to provide an indication of complete cutting of the ingot when part of it is sawn; and the epoxy remnants are generally removed by placing the glass plate and the wafers in hot water for a period of time.

However, as the ingot, which can have a round cross sectional shape or a rectangular cross sectional shape for manufacturing semiconductor products or photovoltaic products, is generally made from brittle materials, part of the wafers can be damaged during the dicing process.

In a typical manufacturing facility, losses of wafers resulting from the dicing process are around 2%, and this problem can get worse when the thickness of wafers is expected to be as thin as possible to reduce material cost.

To avoid the damage of wafers, one solution is to provide a more sophisticated wire sawing apparatus as that disclosed in U.S. Pat. No. 8,256,407. U.S. Pat. No. 8,256,407 provides a multi-wire saw which, at the start of cutting of an ingot, is capable of preventing a wire from being displaced from grooves of guide rollers by utilizing a wire-lifting restraining member, and this can improve the cutting quality.

Although this approach can improve the ingot cutting performance, however, the sliced wafers are still easy to fracture due to the brittle characteristic inherited from the ingot.

To solve the foregoing problem, a novel ingot cutting method is needed.

SUMMARY OF THE INVENTION

One objective of the present invention is to disclose an ingot cutting method, which is capable of dispersing a stress resulting from a wafer-dicing process of an ingot to at least one side wall of the ingot, to protect the diced wafers.

Another objective of the present invention is to disclose an ingot cutting method, which is capable of enhancing the strength of diced wafers of an ingot.

Another objective of the present invention is to disclose an ingot cutting method, which provides a buffer layer on at least one side wall of an ingot to prevent epoxy remnants from sticking with the diced wafers of the ingot.

Still another objective of the present invention is to disclose an ingot cutting method, which can bring forth a high yield rate of diced wafers of an ingot.

To attain the foregoing objectives, an ingot cutting method is proposed, comprising:

forming a layer of nanostructures on at least one surface of an ingot;

depositing a buffer layer on the layer of nanostructures;

fixing the ingot to a mounting plate by applying a layer of epoxy between the buffer layer and the mounting plate;

performing a dicing process on the ingot to get a plurality of wafers; and performing an epoxy removal process on the plurality of wafers.

In one embodiment, the layer of nanostructures is formed by an electrochemical process.

In one embodiment, the layer of nanostructures is formed by an etching process.

In one embodiment, the layer of nanostructures is formed by a deposition process.

In one embodiment, the epoxy removal process includes placing the plurality of wafers and the mounting plate in hot water.

In one embodiment, the ingot is a single-crystal ingot.

In one embodiment, the ingot is a polycrystalline ingot.

In one embodiment, the layer of nanostructures is of a depth ranging from about 1 micro meter to about 10 micro meters.

In one embodiment, the ingot is of a material selected from a group consisting of glass, silicon, germanium, carbon, aluminum, gallium nitride, gallium arsenide, gallium phosphide, aluminum nitride, sapphire, spinel, aluminum oxide, silicon carbide, zinc oxide, magnesium oxide, lithium aluminum dioxide and lithium gallium dioxide.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

Figure 1:
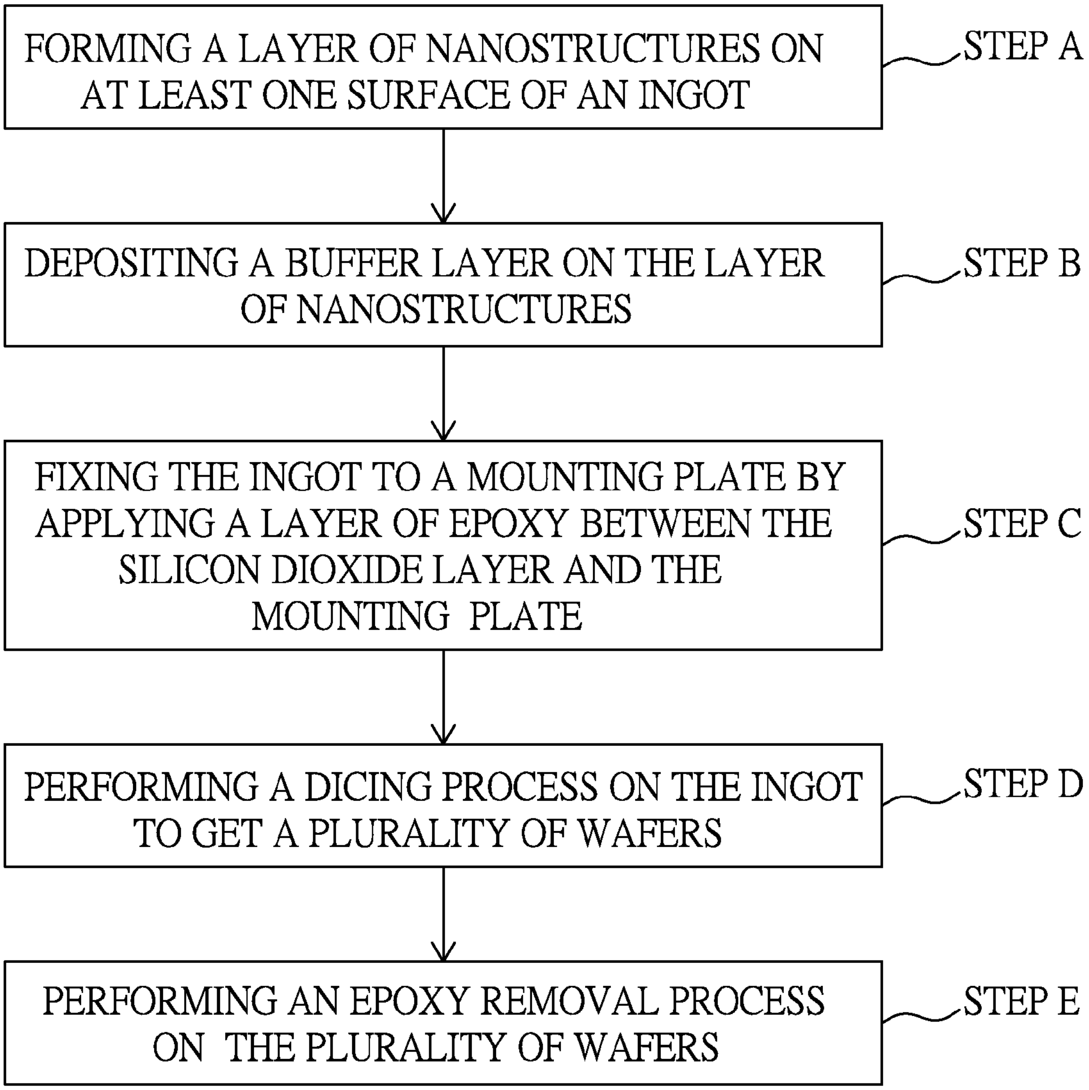
FIG. 1 illustrates a flow chart of an embodiment of an ingot cutting method of the present invention.

The present invention will be described in more detail hereinafter with reference to the accompanying drawings that show the preferred embodiments of the invention. Please refer to FIG. 1, which illustrates a flow chart of an embodiment of an ingot cutting method of the present invention. As illustrated in FIG. 1, the method includes the steps of: forming a layer of nanostructures on at least one surface of an ingot (step a); depositing a buffer layer on the layer of nanostructures (step b); fixing the ingot to a mounting plate by applying a layer of epoxy between the silicon dioxide layer and the mounting plate (step c); performing a dicing process on the ingot to get a plurality of wafers (step d); and performing an epoxy removal process on the plurality of wafers (step e).

Figure 2:
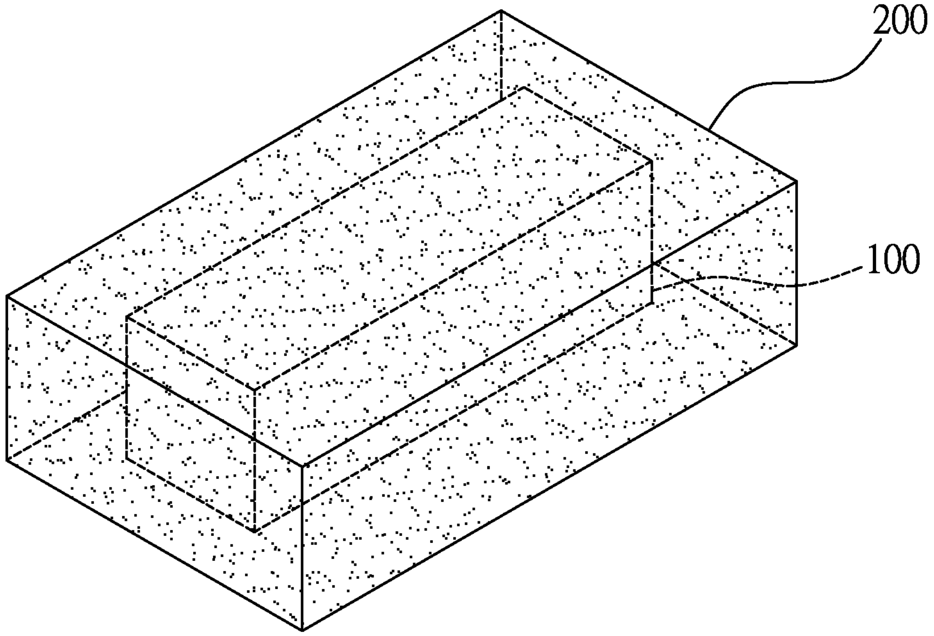
FIG. 2 is an illustrative diagram of an electrochemical process used in the ingot cutting method of FIG. 1.
Figure 3:
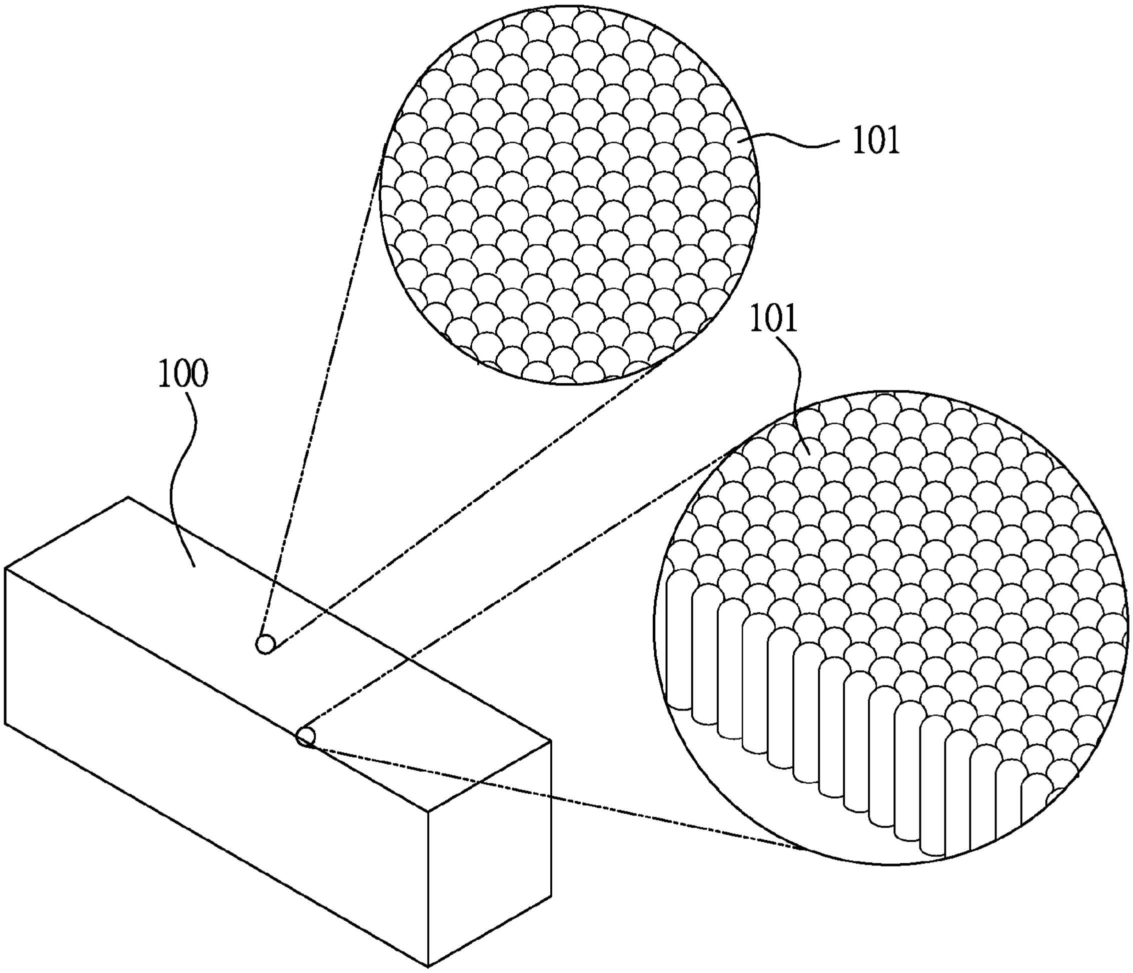
FIG. 3 is an illustrative diagram of an ingot having a layer of nanostructures formed on a side wall thereof.

In step a, the layer of nanostructures can be formed by an electrochemical process, an etching process, or a deposition process, and is preferably of a depth ranging from about 1 micro meter to about 10 micro meters. Please refer to FIG. 2, which is an illustrative diagram of the electrochemical process. As can be seen in FIG. 2, an ingot 100 is undergoing the electrochemical process in a container 200. After the electrochemical process, a layer of nanostructures is formed on at least one side wall of the ingot 100. Please refer to FIG. 3, which is an illustrative diagram of the ingot 100 having a layer of nanostructures formed on a side wall thereof. The depth of the layer of nanostructures can be adjusted by varying a process time. For example, if an electrochemical process with an etching rate of 0.1 μm/min is chosen to implement a 2 μm depth of the nanostructures, the process time will be around 20 minutes.

As the layer of nanostructures is capable of absorbing a force acting on the ingot, the stress resulting from a wafer-dicing process of the ingot can therefore be dispersed to at least one side wall of the ingot, thereby enhancing the yield rate of the diced wafers.

The ingot can be a single-crystal ingot or a polycrystalline ingot, and the material thereof can be selected from a group consisting of glass ($SiO2$), silicon (Si), germanium (Ge), carbon (C), aluminum (Al), gallium nitride (GaN), gallium arsenide (GaAs), gallium phosphide (GaP), aluminum nitride (AlN), sapphire, spinel, aluminum oxide ($Al2O3$), silicon carbide (SiC), zinc oxide (ZnO), magnesium oxide (MgO), lithium aluminum dioxide ($LiAlO2$), and lithium gallium dioxide ($LiGaO2$).

Figure 4:
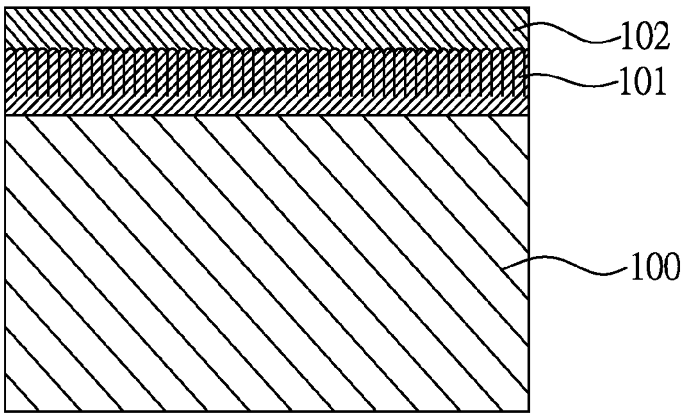
FIG. 4 is an illustrative diagram for an ingot having a silicon dioxide layer deposited on a layer of nanostructures.

In step b, the buffer layer is deposited on the layer of nanostructures to provide a protection layer for the ingot. Please refer to FIG. 4, which is an illustrative diagram for the ingot 100 having a silicon dioxide layer 102 deposited on a layer of nanostructures 101 as the buffer layer, in which the silicon dioxide layer 102 is preferably of a depth ranging from about 0.1 μm to about 2 μm. The process time required for forming the silicon dioxide layer 102 depends on a deposition rate. For example, if the deposition rate is 0.002 μm/sec, the process time will be ranging from about 50 seconds to 1000 seconds.

Figure 5A:
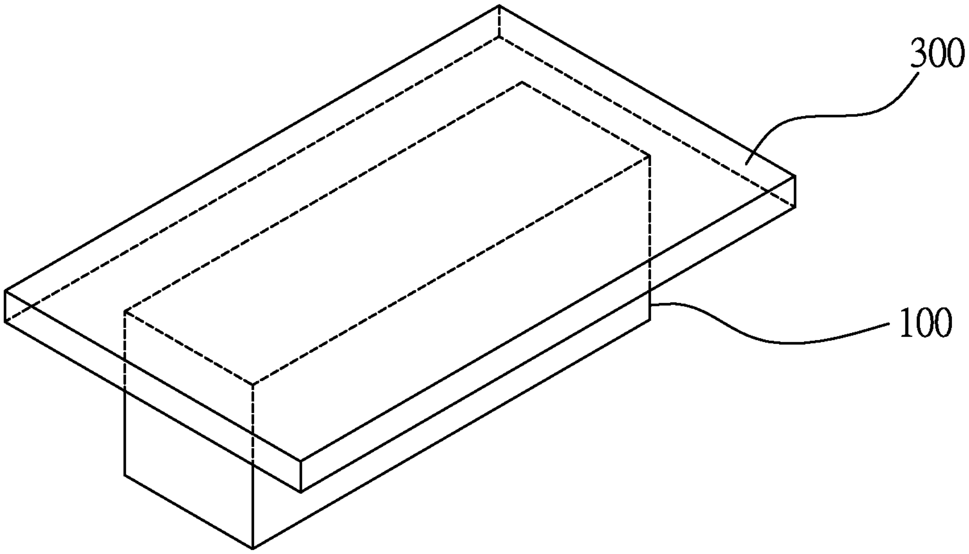
FIG. 5*a* is an illustrative diagram of an ingot of the present invention being fixed onto a mounting plate.
Figure 5B:
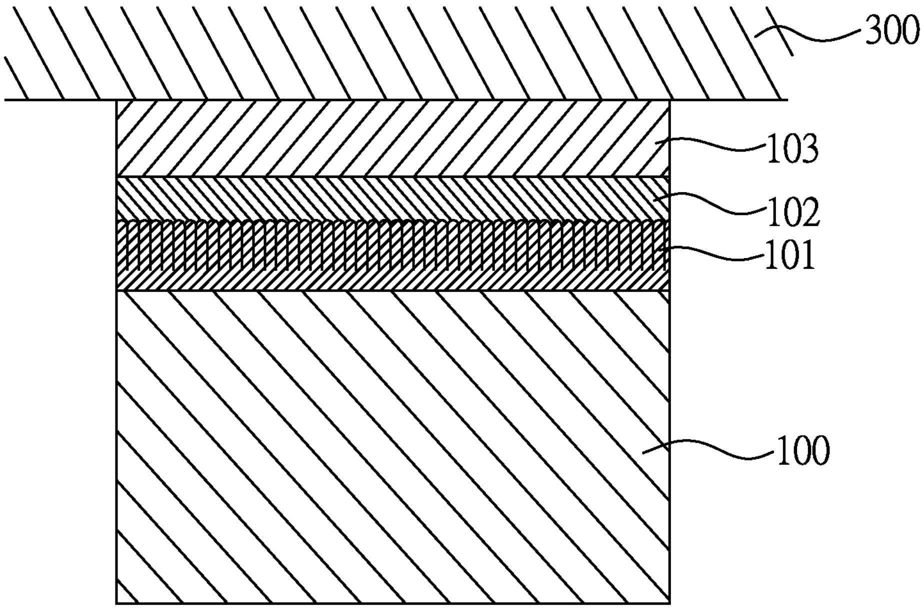
FIG. 5*b* is an illustrative diagram of a cross sectional view of a border area between an ingot of the present invention and a mounting plate.

In step c, a layer of epoxy is used to fix the ingot onto a mounting plate. Please refer to FIG. 5*a*, which is an illustrative diagram of the ingot 100 being fixed onto a mounting plate 300; and FIG. 5*b*, which is an illustrative diagram of a cross sectional view of a border area between the ingot 100 and the mounting plate 300. As can be seen in FIG. 5*b*, a layer of epoxy 103 is applied between the mounting plate 300 and the silicon dioxide layer 102.

Figure 6:
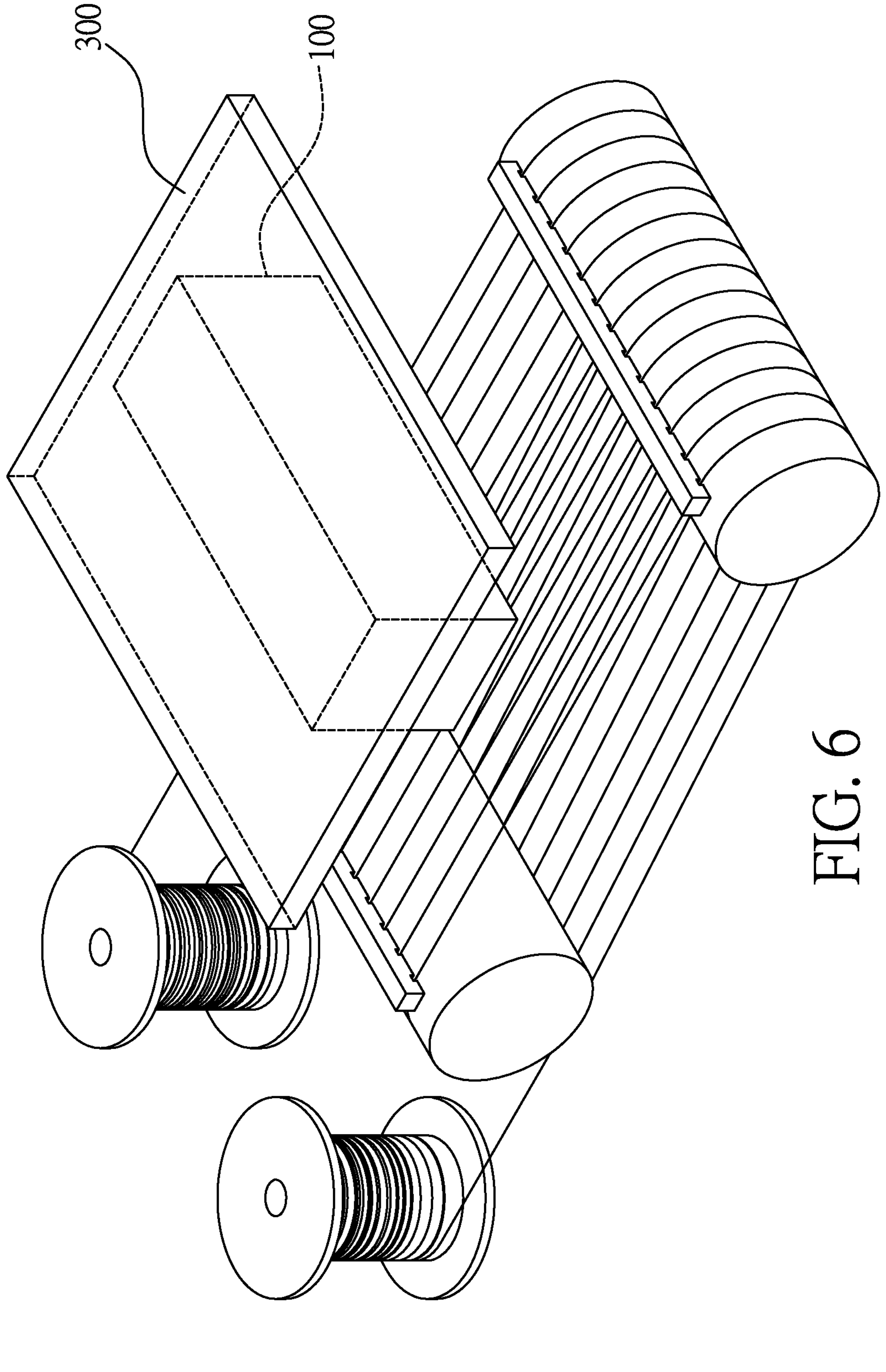
FIG. 6 is an illustrative diagram of an ingot of the present invention undergoing a wire sawing process.

In step d, the dicing process can be a wire sawing process. Please refer to FIG. 6, which is an illustrative diagram of the ingot 100 undergoing a wire sawing process. During the wire sawing process, the layer of nanostructures 101 can absorb the force resulting thereof to prevent the damage of the diced wafers.

Figure 7:
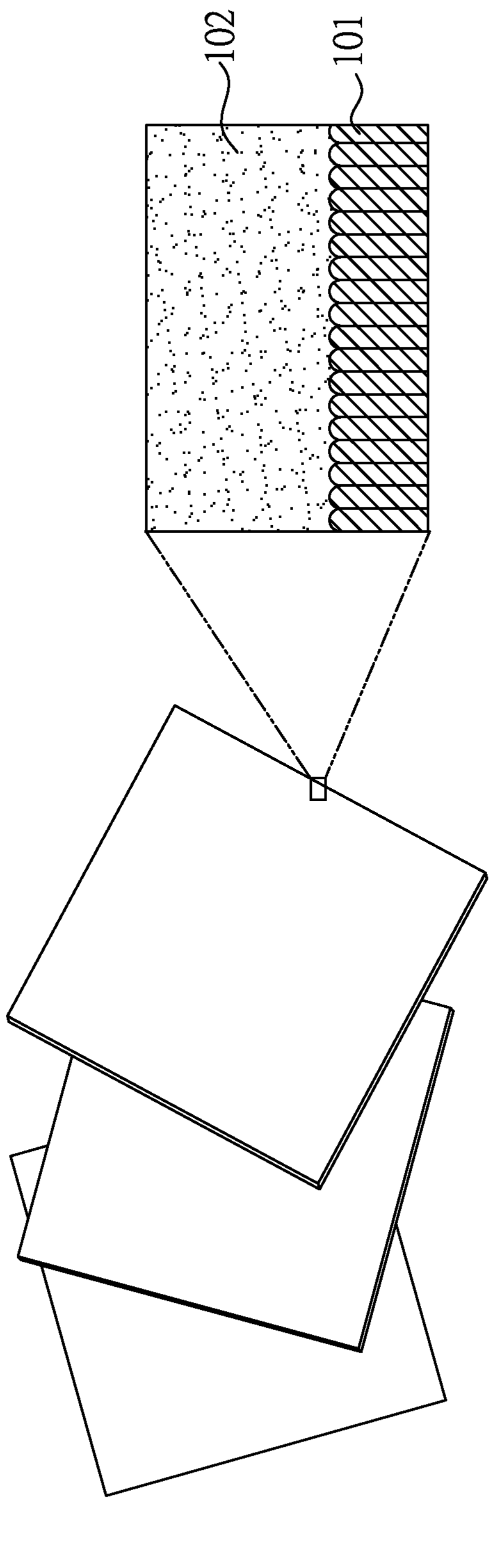
FIG. 7 is an illustrative diagram of a cross sectional view of a fringe area of a diced wafer of the present invention.

In step e, the epoxy removal process includes placing the plurality of wafers and the mounting plate in hot water for a time period. As the epoxy on the silicon dioxide layer 102 can be easily removed, epoxy remnants can therefore be prevented from sticking with the diced wafers of the ingot 100. Please refer to FIG. 7, which is an illustrative diagram of a cross sectional view of a fringe area of a diced wafer. As can be seen in FIG. 7, clean wafers 110 are resulted after the epoxy removal process, and no epoxy remnants is left on the silicon dioxide layer 102 of the wafers 110.

Figure 8A:
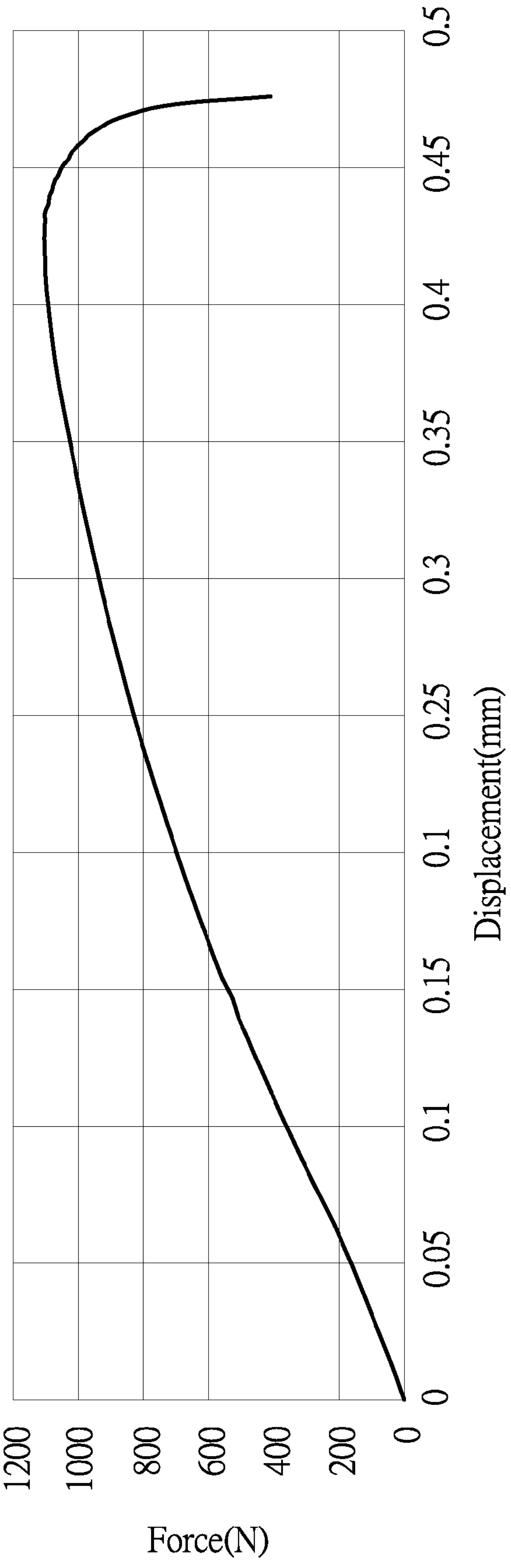
FIG. 8*a* illustrates a tensile strength test result of a conventional ingot sticking with a mounting plate via epoxy.
Figure 8B:
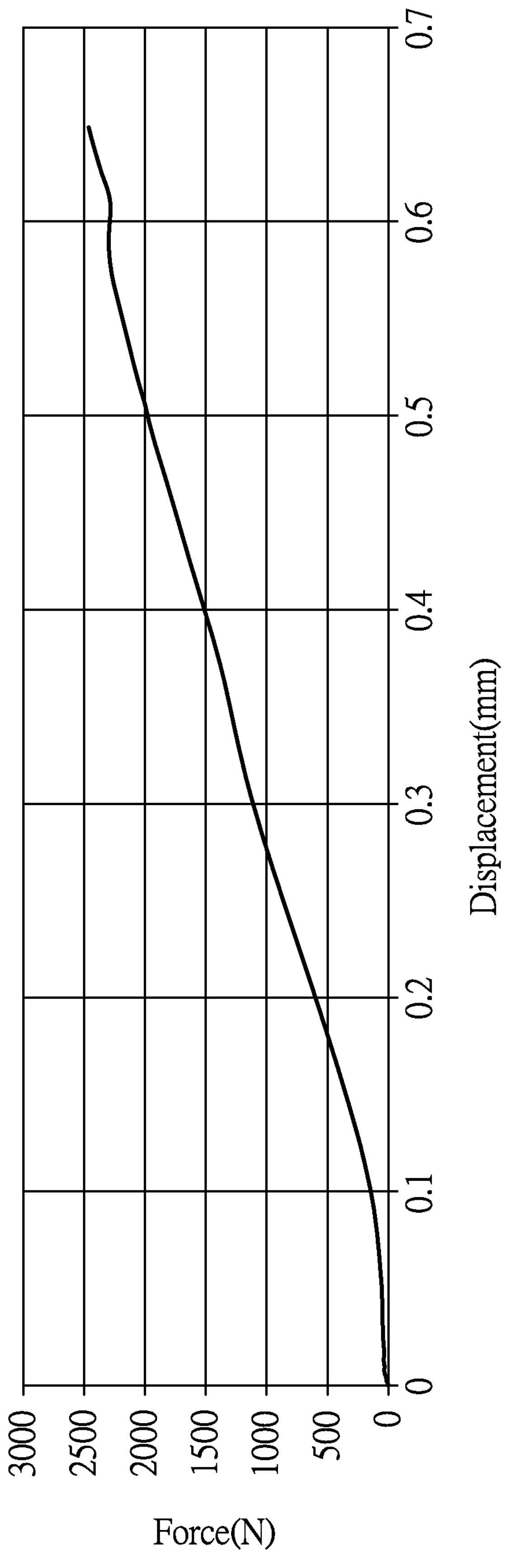
FIG. 8*b* illustrates a tensile strength test result of an ingot of the present invention sticking with a mounting plate via epoxy.

In the method mentioned above, the silicon dioxide layer 102 is used in a consideration to prevent epoxy from sticking with the layer of nanostructures 101, because, apart from being capable of enhancing the strength of the ingot 100, the layer of nanostructures 101 also possesses a characteristic of strong adhesion. Please refer to FIG. 8*a*, which illustrates a tensile strength test result of a conventional ingot sticking with a mounting plate via epoxy; and FIG. 8*b*, which illustrates a tensile strength test result of an ingot of the present invention sticking with a mounting plate via epoxy. As can be seen in FIG. 8*a* and FIG. 8*b*, the tensile strength of the conventional ingot's case is around 1100 N, while the tensile strength of the present invention is above 2500 N, much higher than the conventional ingot's. Therefore, if the layer of epoxy is deposited directly on the layer of nanostructures 101, then it will be very hard to remove epoxy remnants from the layer of nanostructures 101, and the yield rate of the diced wafers 110 will be compromised. With the silicon dioxide layer 102 deposited on the layer of nanostructures 101, a plain plane can be provided to interface with the layer of epoxy 103, and the layer of epoxy 103 can therefore be removed easily.

Due to the designs mentioned above, the present invention offers the following advantages:

1. The ingot cutting method of the present invention can protect the diced wafers of an ingot by dispersing a stress resulting from a wafer-dicing process of the ingot to at least one side wall of the ingot.

2. The ingot cutting method of the present invention is capable of enhancing the strength of diced wafers of an ingot.

3. The ingot cutting method of the present invention provides a buffer layer on at least one side wall of an ingot to prevent epoxy remnants from sticking with the diced wafers of the ingot.

4. The ingot cutting method of the present invention can bring forth a high yield rate of diced wafers of an ingot.

While the invention has been described by way of examples and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance over the conventional structure and further complies with the patent application requirements and is submitted to the Patent and Trademark Office for review and granting of the commensurate patent rights.

What is claimed is:

1. An ingot cutting method capable of reducing wafer damage percentage, comprising:
- forming a layer of nanostructures on at least one surface of an ingot, comprising:
  - the layer of nanostructures being formed by an electrochemical process, an etching process, or a deposition process;
  - the layer having a depth ranging from 1 micro meter to 10 micro meters;
  - the electrochemical process including placing the ingot in a container;
  - the layer of nanostructures being formed on at least one side wall of the ingot;

the depth being adjustable by varying a process time;

the ingot being a single-crystal ingot or a polycrystalline ingot; and material of the ingot being selected from a group consisting of glass ($SiO_2$), silicon (Si), germanium (Ge), carbon (C), aluminum (Al), gallium nitride (GaN), gallium arsenide (GaAs), gallium phosphide (GaP), aluminum nitride (AlN), sapphire, spinel, aluminum oxide ($Al_2O_3$), silicon carbide (SiC), zinc oxide (ZnO), magnesium oxide (MgO), lithium aluminum dioxide ($LiAlO_2$), and lithium gallium dioxide ($LiGaO_2$);

depositing a buffer layer on said layer of nanostructures;

fixing said ingot onto a mounting plate by applying a layer of epoxy between said buffer layer and said mounting plate;

performing a dicing process on said ingot to get a plurality of wafers, comprising:

the dicing process being a wire sawing process;

during the wire sawing process, the layer of nanostructures absorbing the force resulting thereof to avoid damaging the wafers; and performing an epoxy removal process on said plurality of wafers, comprising:

placing the plurality of wafers and the mounting plate in hot water for a time period to remove remnants of the epoxy from the wafers.

2. The ingot cutting method capable of reducing wafer damage percentage as claim 1, wherein said buffer layer is implemented by a silicon dioxide layer.

3. The ingot cutting method capable of reducing wafer damage percentage as claim 2, wherein said silicon dioxide layer has a depth ranging from about 0.1 micro meter to about 2 micro meters.

4. The ingot cutting method capable of reducing wafer damage percentage as claim 1, wherein said ingot has a cross sectional shape selected from a group consisting of a circular shape and a rectangular shape.

* * * * *